(12) United States Patent
Shiobara et al.

(10) Patent No.: US 6,310,120 B1
(45) Date of Patent: Oct. 30, 2001

(54) FLIP-CHIP TYPE SEMICONDUCTOR DEVICE SEALING MATERIAL

(75) Inventors: Toshio Shiobara; Kazuaki Sumita, both of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/499,038

(22) Filed: Feb. 7, 2000

(30) Foreign Application Priority Data

Feb. 12, 1999 (JP) .................................................. 11-33731

(51) Int. Cl.⁷ ................................ C08K 3/22; C08L 63/02
(52) U.S. Cl. ......................... 523/458; 257/789; 257/793; 257/795
(58) Field of Search ................................... 257/789, 793, 257/795; 523/442, 458, 459

(56) References Cited

U.S. PATENT DOCUMENTS

| 4,999,699 | 3/1991 | Christie et al. . |
| 5,089,440 | 2/1992 | Christie et al. . |
| 5,292,688 | 3/1994 | Hsiao et al. . |
| 5,928,595 | 7/1999 | Knapp et al. . |
| 6,018,196 | * 1/2000 | Noddin ................................. 257/777 |

FOREIGN PATENT DOCUMENTS

07041544 * 2/1995 (JP) .

* cited by examiner

Primary Examiner—Robert Dawson
Assistant Examiner—D. Aylward

(57) ABSTRACT

A sealing material comprising (A) a liquid epoxy resin, (B) a curing agent, (C) spherical silica, (D) a soft x-ray non-transmissive spherical inorganic filler, and (E) a curing accelerator is suited as an underfill material for flip-chip type semiconductor devices. The sealing material has improved thin-film infiltration and storage stability. The filled state or seal defects can be readily inspected using soft x-rays.

5 Claims, 1 Drawing Sheet

FLIP-CHIP TYPE SEMICONDUCTOR DEVICE SEALING MATERIAL

This invention relates to a flip-chip type semiconductor device sealing material, especially suited for use as an underfill material so that the filled state is readily ascertainable.

BACKGROUND OF THE INVENTION

With the advance of electric equipment toward smaller size, lighter weight and higher performance, the semiconductor mounting technology has changed from the pin mating type to the surface mounting which now becomes the mainstream. One bare chip mounting technology is flip-chip (FC) mounting. The flip-chip mounting is a technique of providing an LSI chip on its circuit pattern-bearing surface with several to several thousands of electrodes, known as bumps, of about 10 to 100 microns high and joining the chip to electrodes on a substrate with a conductive paste or solder. Then the sealing material used for the protection of FC devices must penetrate into gaps of several tens of microns defined by bumps between the substrate and the LSI chip. Since the resin underfill system requires to fill very narrow gaps with the resin, voids and shorts are often left. It is thus strongly desired to quickly detect such defects in a continuous manner so that defective parts may be eliminated.

In the prior art, an ultrasonic flaw detector is generally used for the detection of defects in devices sealed by the resin underfill method. Although the ultrasonic flaw detector can detect very small defects, it is unamenable to automatic detection, imposing a limit on the quickness of defect detection.

For conventional semiconductor devices, a soft x-ray detector is widely employed for the purpose of detecting wire flow or wire breakage. Where flip-chip type semiconductor devices are sealed with an underfill material using silica as an inorganic filler, the resin layer is so thin that it may become difficult to discriminate voids from the resin with soft x-rays.

SUMMARY OF THE INVENTION

An object of the invention is to provide a flip-chip type semiconductor device sealing material which allows for easy detection of defects with soft x-rays and improves the reliability of the flip-chip type semiconductor device.

It has been found that when a liquid epoxy resin is blended with a specific proportion of a soft x-ray non-transmissive spherical inorganic filler, preferably having a maximum particle diameter of up to 25 $\mu$m and a mean particle diameter of 1 to 5 $\mu$m, the resulting underfill material effectively infiltrates into narrow gaps and facilitates automatic detection of defective parts using soft x-rays. Then the filled state of the underfill material is previously ascertainable, and defective parts are readily sorted out. This contributes to the manufacture of highly reliable semiconductor devices.

Accordingly the invention provides a flip-chip type semiconductor device sealing material comprising (A) 100 parts by weight of a liquid epoxy resin, (B) 0 to 100 parts by weight of a curing agent, (C) 50 to 300 parts by weight of spherical silica per 100 parts by weight of components (A) and (B) combined, (D) an effective amount to prohibit transmission of soft x-rays of a soft x-ray non-transmissive spherical inorganic filler, and (E) 0.01 to 10 parts by weight of a curing accelerator per 100 parts by weight of components (A) and (B) combined.

DESCRIPTION OF THE PREFERRED EMBODIMENTS

Figure 1:
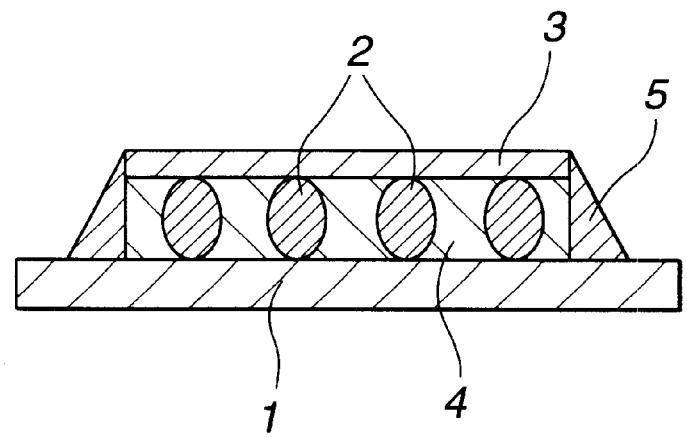
FIG. 1 is a schematic cross-sectional view of one exemplary flip-chip type semiconductor device.

In the flip-chip type semiconductor device sealing material according to the invention, the liquid epoxy resin used as component (A) may be any well-known epoxy resin as long as it has at least two epoxy groups in a molecule. Preferred examples include bisphenol type epoxy resins such as bisphenol A type epoxy resins and bisphenol F type epoxy resins, alicyclic epoxy resins, novolac type epoxy resins such as phenol novolac type epoxy resins and cresol novolac type epoxy resins, naphthalene type epoxy resins, biphenyl type epoxy resins, and cyclopentadiene type epoxy resins. Of these, bisphenol type epoxy resins such as bisphenol A type epoxy resins and bisphenol F type epoxy resins and alicyclic epoxy resins are desirable since they are liquid at room temperature. Any of epoxy resins of the following structure may be added to the foregoing epoxy resins in such an amount as not to adversely affect the interstitial infiltration thereof.

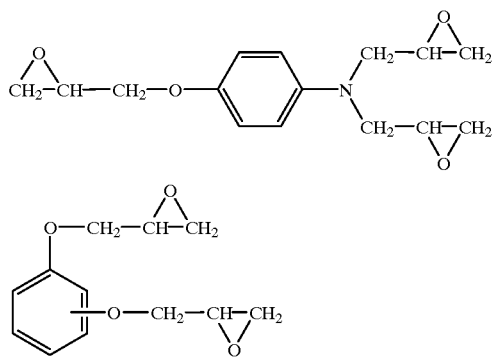

The epoxy resin preferably has a total chlorine content of up to 1,500 ppm, and especially up to 1,000 ppm. When chlorine is extracted from the epoxy resin with water at an epoxy resin concentration of 50% and a temperature of 120° C. over a period of 20 hours, the water-extracted chlorine content is preferably up to 5 ppm. At a total chlorine content of greater than 1,500 ppm or a water-extracted chlorine level of more than 5 ppm, the semiconductor device would become less reliable in the presence of moisture.

The above-described epoxy resin can be cured with the curing accelerator to be described later as component (E) alone. A curing agent as component (B) is used as the case may be. Typical curing agents include acid anhydrides such as methyltetrahydrophthalic anhydride, methylhexahydrophthalic anhydride, hexahydrophthalic anhydride and methylhymic anhydride, and carboxylic acid hydrazides such as dicyandiamide, adipic acid hydrazide and isophthalic acid hydrazide.

Understandably, the amount of the curing agent blended is not critical as long as it is effective for the epoxy resin to cure. Although the amount of curing agent varies with its type, an appropriate amount is such as to give 0.5 to 1.5 and especially 0.8 to 1.2 carboxylic acid groups derived from the acid anhydride groups

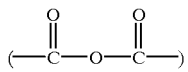

in the curing agent per epoxy group in the epoxy resin. Usually, 100 parts by weight of the liquid epoxy resin is blended with 0 to 100 parts, especially 0 to 80 parts by weight of the curing agent.

Using the curing accelerator alone, the above-described epoxy resin can be cured. Illustrative curing accelerators as component (E) are imidazole derivatives such as 2-methylimidazole, 2-ethyl-4-methylimidazole, 1-cyanoethyl-2-methylimidazole, and 2-phenyl-4,5-dihydroxymethylimidazole, phosphorus derivatives, and cycloamidine derivatives. The imidazole derivatives are useful as a curing accelerator when combined with the acid anhydride curing agent while they are also useful as a curing agent for epoxy resins. An appropriate amount of the curing accelerator used is 0.01 to 10 parts, desirably 0.5 to 5 parts by weight per 100 parts by weight of the epoxy resin and curing agent combined. Less than 0.01 part of the curing accelerator may not be effective for accelerating cure whereas more than 10 parts is effective for accelerating cure, but tends to detract from storage stability. Where an acid anhydride is used as the curing agent, it is desirable that 0.3 to 0.7 mol of the acid anhydride groups be available per mol of epoxy groups in the epoxy resin. Less than 0.3 mol of the acid anhydride groups may achieve insufficient curing whereas more than 0.7 mol of the acid anhydride groups may leave a portion thereof unreacted, leading to a lowering of glass transition temperature. It is more desirable that 0.4 to 0.6 mol of the acid anhydride groups be available per mol of epoxy groups in the epoxy resin.

In the sealing material, spherical silica, typically spherical fused silica is blended as component (C) in an amount of 50 to 300 parts and especially 80 to 250 parts by weight per 100 parts by weight of the epoxy resin and curing agent combined.

If desired, a variety of well-known inorganic fillers may be added to the sealing material of the invention for the purpose of reducing a coefficient of expansion. Useful inorganic fillers include fused silica (other than spherical one), crystalline silica, alumina, boron nitride, aluminum nitride, silicon nitride, magnesia, and magnesium silicate. Among others, spherical alumina is preferable.

In order that the sealing material achieve both an improvement in infiltration and a reduction of linear expansion, the spherical silica and other filler should preferably have a mean particle diameter of less than about 1/10 and a maximum particle diameter of less than about 1/2 of the flip-chip gap height (that is the distance of the substrate-to-chip gap). Most often, the fillers have a maximum particle diameter of up to 50 μm, desirably up to 45 μm, and more desirably up to 25 μm and a mean particle diameter of up to 10 μm, desirably up to 5 μm, and more desirably up to 3 μm. The lower limit of the mean particle diameter of the fillers is usually 0.5 μm, preferably 1 μm.

The fillers inclusive of the spherical silica are preferably blended in a total amount of about 100 to 400 parts, more desirably about 150 to 250 parts by weight per 100 parts by weight of the epoxy resin and the curing agent combined. Less amounts of the fillers would provide a greater coefficient of expansion so that cracks may be incurred in a thermal cycling test. Excessive amounts of the fillers would render the material too viscous, restraining its infiltration in thin film form.

According to the invention, a soft x-ray non-transmissive spherical inorganic filler must be blended as component (D) in order to enable detection with soft x-rays. The filler which can be used herein for this purpose is preferably a zirconium-containing filler. Desirable fillers are metallic zirconium, zirconium oxide and compound oxides in which zirconium and silicon or aluminum are finely and discretely distributed within a single particle obtained by deflagrating metallic zirconium or a mixture of metallic zirconium and metallic silicon or metallic aluminum. Since the compound oxides of this type are produced by deflagration, they are available in the form of spherical particles and quite desirable as the filler for an underfill material.

The soft x-ray non-transmissive spherical inorganic filler should also preferably have a mean particle diameter of less than about 1/10 and a maximum particle diameter of less than about 1/2 of the flip-chip gap height. Most often, the non-transmissive filler has a maximum particle diameter of up to 50 μm, desirably up to 25 μm, and more desirably up to 10 μm and a mean particle diameter of up to 10 μm, desirably up to 5 μm, and more desirably up to 4 μm. The lower limit of the mean particle diameter of the non-transmissive filler is usually 0.5 μm, preferably 1 μm.

Understandably, the mean particle diameter as used herein can be determined, for example, as the weight average (or median diameter) in the particle size distribution as measured by the laser light diffraction method.

In order to automatically detect defective parts with soft x-rays within a short time in a continuous manner, the soft x-ray non-transmissive spherical inorganic filler is used in an effective amount to prohibit transmission of soft x-rays. Where metallic zirconium, zirconium-containing compound oxide, or zirconium oxide is used, the non-transmissive filler is present in such an amount as to give 10 to 200 parts, desirably 15 to 150 parts by weight of zirconium oxide by weight per 100 parts by weight of the liquid epoxy resin and curing agent combined. With less than 10 parts of zirconium oxide, detection with soft x-rays is difficult or impossible. More than 200 parts of zirconium oxide gives rise to such problems as increasing a coefficient of expansion, as well as adding to the cost.

In the sealing material, silicone rubber, silicone oil, liquid polybutadiene rubber or a thermoplastic resin such as methyl methacrylate-butadiene-styrene copolymer may be blended for the purpose of stress reduction. The preferred stress reducing agent is a copolymer obtained through addition reaction between an epoxy or phenolic resin having alkenyl groups and an organopolysiloxane represented by the following average compositional formula (1) and having 20 to 400, preferably 40 to 200 silicon atoms and 1 to 5, preferably 1 to 3, more preferably 2 SiH groups per molecule. The addition reaction takes place between alkenyl groups on the epoxy or phenolic resin and SiH groups on the organopolysiloxane.

$$H_a R_b SiO_{(4-a-b)/2} \tag{1}$$

Herein R is a substituted or unsubstituted monovalent hydrocarbon group, a is a positive number of 0.002 to 0.1, preferably 0.01 to 0.1, b is a positive number of 1.8 to 2.2, preferably 1.95 to 2.05, and the sum of a and b is from 1.81 to 2.3, preferably 1.96 to 2.06 (i.e., $1.81 \leq a+b \leq 2.3$, preferably $1.96 \leq a+b2.06$).

The monovalent hydrocarbon groups represented by R are preferably those of 1 to 10 carbon atoms, especially 1 to 8 carbon atoms, for example, alkyl groups such as methyl, ethyl, propyl, isopropyl, butyl, isobutyl, tert-butyl, hexyl, cyclohexyl, octyl, and decyl; alkenyl groups such as vinyl, allyl, propenyl, butenyl, and hexenyl; aryl groups such as phenyl, xylyl and tolyl; and aralkyl groups such as benzyl, phenylethyl and phenylpropyl. Also included are halogen-substituted monovalent hydrocarbon groups wherein some or all of the hydrogen atoms in the foregoing hydrocarbon groups are replaced by halogen atoms such as chlorine, fluorine and bromine, for example, chloromethyl, bromoethyl and trifluoropropyl.

Among others, copolymers of the following structures are desirable.

The sealing material of the invention can be prepared, for example, by simultaneously or separately agitating, dissolving, mixing and dispersing the epoxy resin, curing agent, curing accelerator, inorganic fillers, and other optional ingredients while heating if desired. The device for mixing, agitating and dispersing the ingredients is not critical although an attritor, three-roll mill, ball mill or planetary mixer each equipped with agitating and heating means is generally used. A suitable combination of these devices is also useful.

Referring to FIG. 1, a flip-chip type semiconductor device to be encapsulated with the sealing material of the invention is illustrated as comprising an organic substrate 1 having a

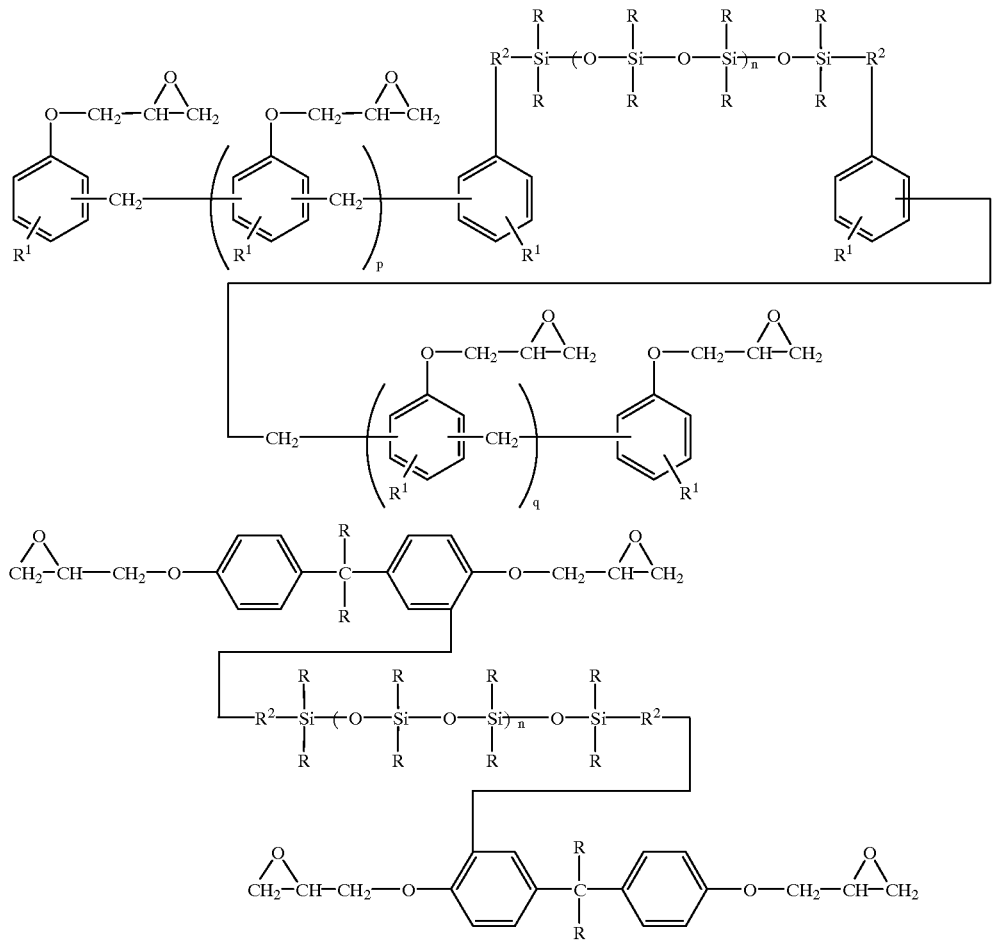

Herein, R is as defined above, $R^1$ is hydrogen or alkyl of 1 to 4 carbon atoms, $R^2$ is —CH$_2$CH$_2$CH$_2$—, —OCH$_2$—CH(OH)—CH$_2$—O—CH$_2$CH$_2$CH$_2$— or —O—CH$_2$CH$_2$CH$_2$—, letter n is an integer of 4 to 199, preferably 19 to 99, p is an integer of 1 to 10, and q is an integer of 1 to 10.

The copolymer is blended in such amounts that 0 to 20 parts, especially. 2 to 15 parts by weight of the diorganopolysiloxane unit is available per 100 parts by weight of the epoxy resin and curing agent combined. Then the stress can be further reduced.

In the sealing material, various other additives are blended if necessary. Such additives include carbon-functional silanes for improving tackiness, pigments (e.g., carbon black), dyestuffs, antioxidants, and surface treating agents (e.g., γ-glycidoxypropyltrimethoxysilane).

wiring pattern-bearing surface (upper surface in the figure). A semiconductor chip 3 is mounted on the wiring pattern-bearing surface via a plurality of bumps 2 to define gaps between the substrate 1 and the semiconductor chip 3 and also between the bumps 2. The gaps are filled with an underfill material 4 and sealed along sides thereof with a fillet material 5. The sealing material of the invention is advantageous especially in forming the underfill material.

When the sealing material of the invention is used as an underfill material, its cured product should preferably have a coefficient of thermal expansion (CTE) of 20 to 40 ppm/°C. at temperatures below its glass transition temperature (Tg). Any of well-known sealing materials may be used as the fillet material although a liquid epoxy resin composition similar to the above-mentioned one may also be used. When a liquid epoxy resin composition is used the fillet material, its cured product should preferably have a CTE of 10 to 20 ppm/° C. at temperatures below its Tg.

EXAMPLE

Examples of the invention are given below by way of illustration and not by way of limitation.

Examples 1–4 and Comparative Examples 1–3

Seven epoxy resin compositions were prepared by uniformly milling the components shown in Tables 1 and 2 in a three-roll mill. The following tests were carried out on these epoxy resin compositions. The results are also shown in Tables 1 and 2.

Gelling Time

The time passed until the composition gelled on a hot plate at 150° C. was measured.

Infiltration Test

Figure 2A:
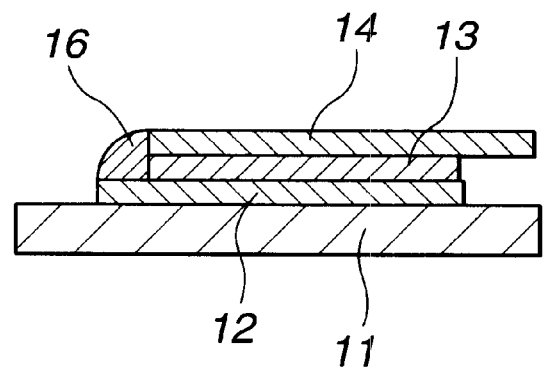
FIG. 2 illustrates a test piece used in an infiltration test, FIG. 2A being a side view and FIG. 2B being a plan view.
Figure 2B:
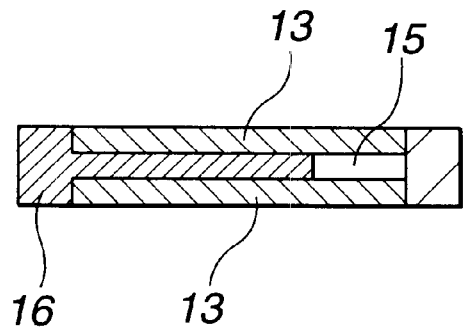

As shown in FIGS. 2A and 2B, a lower slide glass plate 12 was rested on a hot plate 11. A pair of 80-micron polyimide films 13 and 13 laterally spaced 1 cm from each other were set on the glass plate 12. An upper slide glass plate 14 was rested thereon. The slide glass plates 12, 14 defined with the two polyimide films 13, 13 an elongated space 15 having a width of 1 cm and a height of 80 μm. A mass of epoxy resin composition 16 was placed on the lower slide glass plate 12 at one end of the space 15. With this setting, the hot plate 11 was heated at 80° C. or 120° C. whereupon the epoxy resin composition 16 infiltrated through the space 15. The infiltration time was measured until the composition 16 infiltrated and reached a distance of 20 mm from the one end of the space 15.

Defect detection with soft x-rays

A silicon chip of 10 mm×10 mm having 400 bumps formed thereon was rested on a BT substrate. Using a dispenser, an epoxy resin composition as an underfill material was applied dropwise to one side of the device for forming a seal. The composition was cured there by heating. Using soft x-rays, the infiltration of the underfill material and voids were examined.

TABLE 1

|  | EX 1 | EX 2 | EX 3 | EX 4 |
|---|---|---|---|---|
| Composition (parts by weight) |  |  |  |  |
| RE310 | 50 | — | 60 | 100 |
| RE304 | — | 100 | — | — |
| MH700 | 40 | — | 40 | — |
| SO32H | 150 | 50 | 75 | 150 |
| Spherical compound oxide A | — | — | — | — |
| Spherical compound oxide B | 50 (25)* | — | 75 (38)* | — |
| Spherical compound oxide C | — | 150 (75)* | — | — |
| Spherical compound oxide D | — | — | — | 20 (20)* |
| Spherical compound oxide E | — | — | — | — |
| KBM403 | 0.2 | 0.3 | 0.3 | 0.3 |
| 2P4MZ | — | 1.5 | — | 1.5 |
| HX3741 | 3 | — | 3 | — |

TABLE 1-continued

|  | EX 1 | EX 2 | EX 3 | EX 4 |
|---|---|---|---|---|
| Characteristics |  |  |  |  |
| Gelling time (sec/150° C.) | 65 | 60 | 71 | 58 |
| Infiltration time (sec/120° C.) | — | 85 | — | 76 |
| Infiltration time (sec/80° C.) | 80 | — | 120 | — |
| Defect detection with soft x-rays | easily detectable | easily detectable | easily detectable | easily detectable |

*Amount as zirconium oxide

TABLE 2

|  | CE 1 | CE 2 | CE 3 |
|---|---|---|---|
| Composition (parts by weight) |  |  |  |
| RE310 | 100 | 60 | — |
| RE304 | — | — | 100 |
| MH700 | — | 40 | — |
| SO32H | 200 | 50 | 120 |
| Spherical compound oxide A | — | 25 (7.5)* | — |
| Spherical compound oxide B | — | — | — |
| Spherical compound oxide C | — | — | — |
| Spherical compound oxide D | — | — | — |
| Spherical compound oxide E | 20 (2)* | — | 80 (8)* |
| KBM403 | 0.3 | 0.3 | 1.0 |
| 2P4MZ | 1.5 | — | 1.5 |
| HX3741 | — | 3 | — |
| Characteristics |  |  |  |
| Gelling time (sec/150° C.) | 65 | 70 | 55 |
| Infiltration time (sec/120° C.) | 115 | — | 108 |
| Infiltration time (sec/80° C.) | — | 186 | — |
| Defect detection with soft x-rays | undetectable | undetectable | undetectable |

*Amount as zirconium oxide
Note:
RE310: bisphenol A type epoxy resin by Nippon Kayaku K.K.
RE304: bisphenol F type epoxy resin by Nippon Kayaku K.K.
MH700: methyltetrahydrophthalic anhydride by Shin-Nippon Rika K.K.
SO32H: spherical silica having a maximum particle diameter of 45 μm and a mean particle diameter of 2 μm by Admatechs K.K.
Shperical oxides A to E: see Table 3
KBM403: γ-glycidoxypropyltrimethoxysilane by Shin-Etsu Chemical Co., Ltd.
2P4MZ: 2-phenyl-4-methylimidazole by Shikoku Chemicals K.K.
HX3741: microcapsulated catalyst containing an imidazole compound by Asahi-Ciba K.K.

TABLE 3

| Spherical oxide | Silicon (wt %) | Aluminum (wt %) | Zirconium (wt %) | Maximum particle diameter (μm) | Mean particle diameter (μm) |
|---|---|---|---|---|---|
| A | 70 | — | 30 | 25 | 5 |
| B | 50 | — | 50 | 15 | 2.5 |
| C | — | 50 | 50 | 25 | 3.8 |
| D | — | — | 100 | 25 | 4 |
| E | 90 | — | 10 | 25 | 4 |

There has been described a flip-chip type semiconductor device sealing material which has an improved thin-film infiltration capability and storage stability and is detectable for short filled state and defects with soft x-rays.

Japanese Patent Application No. 11-033731 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A flip-chip type semiconductor device sealing material comprising (A) 100 parts by weight of a liquid epoxy resin, (B) 0 to 100 parts by weight of a curing agent, (C) 50 to 300 parts by weight of spherical silica per 100 parts by weight of components (A) and (B) combined, (D) an effective amount to prohibit transmission of soft x-rays of a soft x-ray non-transmissive spherical inorganic filler, 50–100 weight-% of which is composed of a spherical zirconium containing compound oxide or zirconium oxide, and (E) 0.01 to 10 parts by weight of a curing accelerator per 100 parts by weight of components (A) and B) combined.

2. The sealing material of claim 1, wherein the spherical zirconium-containing compound oxide or zirconium oxide is present in such an amount as to give 10 to 200 parts by weight of zirconium oxide by weight per 100 parts by weight of components (A) and (B) combined.

3. The sealing material of claim 1, wherein component (D) comprises 50 weight-% silicon and 50 weight-% zirconium.

4. The sealing material of claim 1, wherein component (D) comprises 50 weight-% aluminum and 50 weight-% zirconium.

5. The sealing material of claim 1, wherein component (D) comprises 100 weight-% zirconium.

* * * * *